United States Patent [19]

Koguchi et al.

[11] 4,176,370
[45] Nov. 27, 1979

[54] PHOTOVOLTAIC CONVERTER

[75] Inventors: Nobuyuki Koguchi; Katashi Masumoto, both of Tokyo, Japan

[73] Assignee: National Research Institute for Metals, Tokyo, Japan

[21] Appl. No.: 880,160

[22] Filed: Feb. 22, 1978

[30] Foreign Application Priority Data

Feb. 24, 1977 [JP] Japan ................... 52-18677

[51] Int. Cl.$^2$ ........................................... H01L 27/14
[52] U.S. Cl. ........................................ 357/30; 357/16; 357/61
[58] Field of Search ............................. 357/30, 16, 61

[56] References Cited
U.S. PATENT DOCUMENTS 3,986,194 10/1976 Masumoto ......................... 357/18

Primary Examiner—Martin H. Edlow
Attorney, Agent, or Firm—Wenderoth, Lind & Ponack

[57] ABSTRACT

A photovoltaic converter, useful for example as a photodetector or solar cell, comprising a main unit consisting of a p-n heterojunction of a p- or n-type magnetic semiconductor $MCr_2X_4$ in which M is Zn, Cd or Hg and X is O, S, Se or Te and an n- or p-type semiconductor $M'In_2S_4$ in which M' is Zn, Cd or Hg and which has an optical absorption edge at a shorter wavelength than the optical absorption edge of the $MCr_2X_4$; a first electrode ohmically fixed to the surface of the $MCr_2X_4$; and a second electrode fixed ohmically to the surface of the $M'In_2S_4$ and allowing light to reach the surface of $M'In_2S_4$. With a decrease in temperature, the photovoltaic converter has the long wavelength edge of its spectral photovoltaic response shifted to a longer wavelength contrary to known photovoltaic converters.

3 Claims, 3 Drawing Figures

PHOTOVOLTAIC CONVERTER

BACKGROUND OF THE INVENTION

1. Field of the Invention

This invention relates to a photovoltaic converter which can be used, for example, as a photodetector or a solar cell

2. Description of the Prior Art

Photovoltaic converters which have been previously suggested and put to practical use as, for example, photodetectors or solar cells make use of a p-n homojunction of a nonmagnetic semiconductor such as a p-n homojunction of Si, or a p-n heterojunction of two different nonmagnetic semiconductor such as a p-n heterojunction of p-type GaAs and n-type ZnSe. In these known photovoltaic converters, the long wavelength edges of their spectral photovoltaic responses have negative temperature coefficients corresponding to an electronic transition between the valence band and conduction band of the semiconductors used, or an electronic transition between the impurity level and the valence or conduction band of the semiconductors used. In other words, when the temperatures of the known photovoltaic converters decrease, the long wavelength edges of their spectral photovoltaic responses shift to shorter wavelengths. For example, in a photovoltaic converter utilizing a silicon p-n homojunction, the long wavelength edge of spectral photovoltaic response is 1.12 $\mu$m at 300° K. but 1.09 $\mu$m at 100° K. On the other hand, the spectral photovoltaic response of a photovoltaic converter utilizing a p-n heterojunction of p-type GaAs and n-type ZnSe has a long wavelength edge of 0.92 $\mu$m at 300° K. and 0.88 $\mu$m at 100° K. in its spectral photovoltaic response.

When the photovoltaic converter is used as, for example, a photodetector, it is desirably maintained at a relatively low temperature of, say, 100° K.±30° K. However, as the temperature of such a known photovoltaic converter decreases, the long wavelength edge of its spectral photovoltaic response shifts to a shorter wavelength. Thus, at such a relatively low temperature, the photovoltaic converter cannot respond, or has a markedly reduced sensitivity, to light of relatively long wavelengths such as infrared rays,

SUMMARY OF THE INVENTION

It is an object of this invention to provide a novel photovoltaic converter which is free from the aforesaid defect of known photovoltaic converters.

Another object of this invention is to provide a novel photovoltaic converter which when held at a decreased temperature, has the long wavelength edge of its spectal photovoltaic response shifted to a longer wavelength contrary to known photovoltaic converters, and therefore can respond with sufficient sensitivity to light of relatively long wavelengths such as infrared rays at relatively low temperatures of, for example, 100° K.±30° K.

We have now found that by using a p-n heterojunction of a p- or n-type magnetic semiconductor $MCr_2X_4$ in which M represents any one of Zn, Cd and Hg which are metals of group II of the periodic table, and X represents any one of O, S, Se and Te which are elements of group VI of the periodic table and an n-or p-type semiconductor $M'In_2S_4$ in which M' represents any one of Zn, Cd and Hg and which has an optical absorption edge at a shorter wavelength than the optical absorption edge of the first-mentioned semiconductor, a photovoltaic converter can be obtained which when held at a decreased temperature, has the long wavlength edge of its spectral photovoltaic response shifted to a longer wavelength, and can respond with sufficient sensitivity to light of relatively long wavelength such as infrared light even at relatively low temperatures of, say, 100° K.±30° K.

According to this invention, there is provided a photovoltaic converter comprising a main unit consisting of a p-n heterojunction of a p- or n-type magnetic semiconductor $MCr_2X_4$ in which M represents any one of Zn, Cd and Hg and X represents any one of O, S, Se and Te and an n- or p-type semiconductor $M'In_2S_4$ in which M' represents any one of Zn, Cd and Hg and which has an optical absorption edge at a shorter wavelength than the optical absorption edge of the $MCr_2X_4$; a first electrode fixed ohmically to the surface of the $MCr_2X_4$; and a second electrode fixed ohmically to the surface of the $M'In_2S_4$ and allowing light to reach the surface of $M'In_2S_4$.

The long wavelength edge of the spectral photovoltaic response of the photovoltaic converter in accordance with this invention coincides substantially with the optical absorption edge of the magnetic semiconductor $MCr_2X_4$ which shifts to a longer wavelength at a lower temperature. Hence, the long wavelength edge shifts to a longer wavelength as the temperature of the photovoltaic converter decreases.

The magnetic semiconductor $MCr_2X_4$ is preferably $HgCr_2Se_4$, and the nonmagnetic semiconductor $M'In_2S_4$ is preferably $CdIn_2S_4$. With these preferred semiconductors, the range of the spectral photovoltaic converter is broadest. When $HgCr_2Se_4$ and $CdIn_2S_4$ are used, it is preferred to form the first electrode by vacuum-depositing Au on the surface of $HgCr_2Se_4$ and the second electrode by vacuum-depositing In on the surface of $CdIn_2S_4$.

DETAILED DESCRIPTION OF PREFERRED EMBODIMENTS

Figure 1:
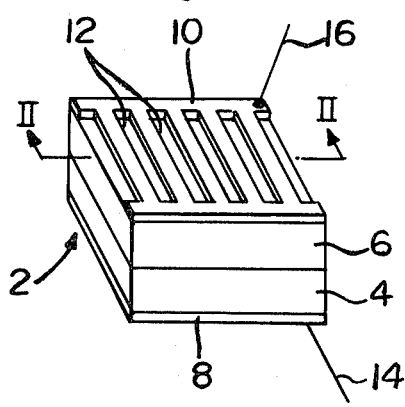
FIG. 1 is a perspective view of one example of the photovoltaic converter in accordance with this invention.
Figure 2:
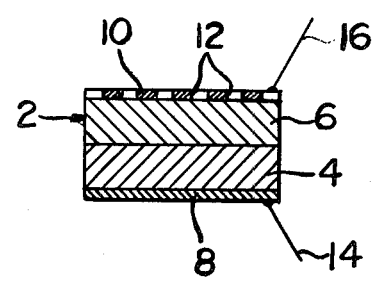
FIG. 2 is a sectional view taken along the line II—II of FIG. 1.

Referring to FIGS. 1 and 2, the photovoltaic converter of this invention which is generally shown at 2 includes a main unit consisting of a p-n heterojunction of a p- or n-type magnetic semiconductor 4 and an n- or p-type nonmagnetic semiconductor 6. The magnetic conductor 4 is $MCr_2X_4$ wherein M represents any one of Zn, Cd and Hg which are metals of group II of the periodic table, and X represents any one of O, S, Se and Te which are elements of group VI of the periodic table. It is preferably $HgCr_2Se_4$. The nonmagnetic semiconductor 6 is $M'In_2S_4$ in which M' represents Zn, Cd and Hg, and has an optical absorption edge at a shorter wavelength than the optical absorption edge of the magnetic semiconductor 4. Preferably, the nonmagnetic semiconductor 6 is $CdIn_2S_4$.

The main unit can be conveniently made by (i) epitaxially growing single crystals of an n- or p-type semiconductor $M'In_2S_4$ on a substrate of single crystals of a p- or n-type magnetic semiconductor $MCr_2X_4$ by a known crystal growing method such as a liquid phase method, a vapor phase method, a vapor deposition method, a sputtering method or a molecular beam method, or (ii) epitaxially growing single crystals of a p- or n-type magnetic semiconductor $MCr_2X_4$ on a substrate of single crystals of an n- or p-type semiconductor $M'In_2S_4$ by the same known crystal growing method.

The photovoltaic converter 2 further includes a first electrode 8 fixed ohmically to the surface, preferably the entire surface, of the magnetic semiconductor 4, and a second electrode 10 fixed ohmically to the surface, preferably the entire surface, of the semiconductor 6. The second electrode 10 has a structure which allows light to reach the surface of the semiconductor 6, for example a lattice structure having a plurality of openings 12 which permit passage of light. Lead wires 14 and 16 are secured respectively to the first electrode 8 and the second electrode 10.

The photovoltaic converter 2 in accordance with this invention as described above responds to the light which falls upon the surface of the semiconductor 6 through the openings 12 of the electrode 10, and generates a voltage between the first electrode 8 and the second electrode 10. The long wavelength edge of the spectral photovoltaic response of the photovoltaic converter 2 coincides substantially with the optical absorption edge of the magnetic semiconductor 4 which shifts to a longer wavelength at a lower temperature. The long wavelength edge, therefore, shifts to a longer wavelength as the temperature of the photovoltaic converter 2 decreases. For example, in a photovoltaic converter including a main unit consisting of a p-n heterojunction of p-type $HgCr_2Se_4$ and n-type $CdIn_2S_4$, the long wavelength edge of the spectral photovoltaic responds coincides substantially with the optical absorption edge of $HgCr_2Se_4$, and is about 1.7 μm at 296° K. and at least about 2.6 μm at 79° K., as is seen from the Example given hereinbelow.

The photovoltaic converter in accordance with this invention can therefore be used effectively as a photodetector or solar cell not only at ordinary room temperatures but also at relatively low temperatures of, for example, 100° K.±30° K. It is especially useful as a photodetector for detecting light of relatively long wavelengths at relatively low temperatures.

EXAMPLE

A main unit consisting of a p-n heterojunction of $HgCr_2Se_4$ and $CdIn_2S_4$ was made by epitaxially growing n-type semiconductor $CdIn_2S_4$ on a substrate of single crystals of p-type magnetic semiconductor $HgCr_2Se_4$ by a vapor phase method as described in (a) to (c) below.

(a) First, single crystals of p-type magnetic semiconductor $HgCr_2Se_4$ used as the substrate were prepared in the following manner.

HgSe powder, Cr powder, Se powder and Ag as an additive for giving a p-type semiconductor were mixed in a mole ratio of 0.985:2:3:0.015. The mixture was hermetically sealed into a cylindrical quartz ampoule having an inside diameter of 12 mm and a length of 80 mm, heated at 550° C. for 94 hours, and cooled. The mixture was then uniformly mixed in a mortar, heated further at 550° C. for 45 hours, and cooled to form a polycrystal powder of $HgCr_2Se_4$ containing 1.5 mole% of Ag. Single crystals of $HgCr_2Se_4$ were produced by a known closed tube chemical transport method using the resulting powder as a raw material and $CrCl_3$ as a transport agent. Specifically, about 2 g of $HgCr_2Se_4$ powder and 40 mg of $CrCl_3$ powder were hermetically sealed into the high temperature end portion of a cylindrical quartz ampoule having an inside diameter of 17 mm and a length of 100 mm. The ampoule was placed into a horizontally elongated Kanthal alloy wire furnace having two heating zones. Transportation was performed for 2 weeks while maintaining the temperature of the single crystal precipitating end at 670° C. and the temperature of the high temperature end portion at 688° C. As a result, many single crystals of $HgCr_2Se_4$ having an octahedral or pyramidal shape surrounded by the (111) plane of a triangle measuring about 2 to 3 mm at each side were obtained.

(b) Then, $CdIn_2S_4$ powder was prepared in the following manner. Granular Cd, granular In and S powder were mixed in a mole ratio of 1:2:4. The mixture was hermetically sealed into a cylindrical quartz ampoule having an inside diameter of 10 mm and a length of 80 mm. The quartz ampoule was suspended in a vertically elongated Kanthal alloy wire furnace, and heated from room temperature to 600° C. at a rate of 100° C./hour, and then maintained for 4 days. Then, it was heated to 700° C. at a rate of 50° C./hour, and maintained for 4 days. It was further heated to 1200° C. at a rate of 50° C./hour, and maintained for 6 hours. It was then cooled to 900° C. at a rate of about 20° C./hour, and cooled with water. The resulting ingot of single crystals was pulverized to form $CdIn_2S_4$ powder.

(c) The $CdIn_2S_4$ powder obtained by the procedure described in (b) was epitaxially grown in the vapor phase on the entire surfaces of the single crystals of $HgCr_2Se_4$ obtained by the procedure of (a). Specifically, many $HgCr_2Se_4$ single crystals as obtained by the procedure (a) were dipped for 5 minutes in an etching solution consisting of a mixture of $HNO_3$, HCl and $H_2O$ in a volume ratio of 2:6:3, and then washed with water. The treated single crystals of $HgCr_2Se_4$ were placed into the low temperature end portion of a cylindrical ampoule having an inside diameter of 8 mm and a length of 300 mm, and 60 mg of $CdIn_2S_4$ and 3 mg of iodine as a transport agent were placed in the high temperature end portion of the ampoule. The ampoule was then hermetically sealed. The ampoule was placed in a horizontally elongated Kanthal alloy wire furnace having two heating zones, and maintained for 1.5 hours while adjusting the temperature of the low temperature end portion to 480° C. and the temperature of the high temperature end portion to 780° C. Then, the ampoule was taken out of the furnace, and cooled in the air. Thus, a p-n heterojunction was obtained in which an epitaxial film of single crystals of $CdIn_2S_4$ having a thickness of about 20 μm was grown on each of the single crystals of $HgCr_2Se_4$.

Since the epitaxial film of the single crystals of $CdIn_2S_4$ as grown had a high electric resistance and was not suitable for photovoltaic converters, it was treated in the manner mentioned below to reduce the electric resistance. Specifically, the heterojunction of p-type $HgCr_2Se_4$ and n-type $CdIn_2S_4$ was placed in the high temperature end portion of a cylindrical quartz ampoule having an inside diameter of 8 mm and a length of 60 mm, and granular Cd was placed into the low temperature end portion of the ampoule. The ampoule was hermetically sealed, and maintained for 45 minutes in a horizontally elongated Kanthal alloy wire furnace while adjusting the temperature of the high temperature end portion to 480° C. and the temperature of the low temperature end portion to 450° C. The ampoule was then taken out of the furnace, and cooled with water. One surface (111) of the treated heterojunction was polished to expose $HgCr_2Se_4$ at this surface to produce a main unit consisting of a p-n heterojunction of $HgCr_2Se_4$ and $CdIn_2S_4$.

Au was vacuum-deposited on the entire surface of $HgCr_2Se_4$ exposed by polishing as described above. Indium (In) was vacuum-deposited on the surface of $CdIn_2S_4$ so that it had a plurality of openings as in the electrode 10 illustrated in FIGS. 1 and 2. The entire structure was then heat-treated at about 300° C. in vacuo for 2 minutes to form a first electrode of Au fixed ohmically to the surface of $HgCr_2Se_4$ and a second electrode of In fixed ohmically to the surface of $CdIn_2S_4$. The photovoltaic converter produced can, as required, be processed further into the shape of rectangular parallelpiped as illustrated in FIGS. 1 and 2.

The light from a tungsten-filament lamp was passed through a spectrograph and caused to fall on the surface of $CdIn_2S_4$ through the openings of the second electrode, and the relative spectral photovoltaic responses of the resulting photovoltaic converter at 296° K. and 79° K. were determined. The result obtained at 296° K. is shown at curve A in FIG. 3, and the result obtained at 79° K. is shown at curve B in FIG. 3. Because the maximum wavelength of light from the tungsten-filament lamp used as a light source was about 2.6 $\mu m$, the photovoltaic response of the device at longer wavelengths could not be measured.

Figure 3:
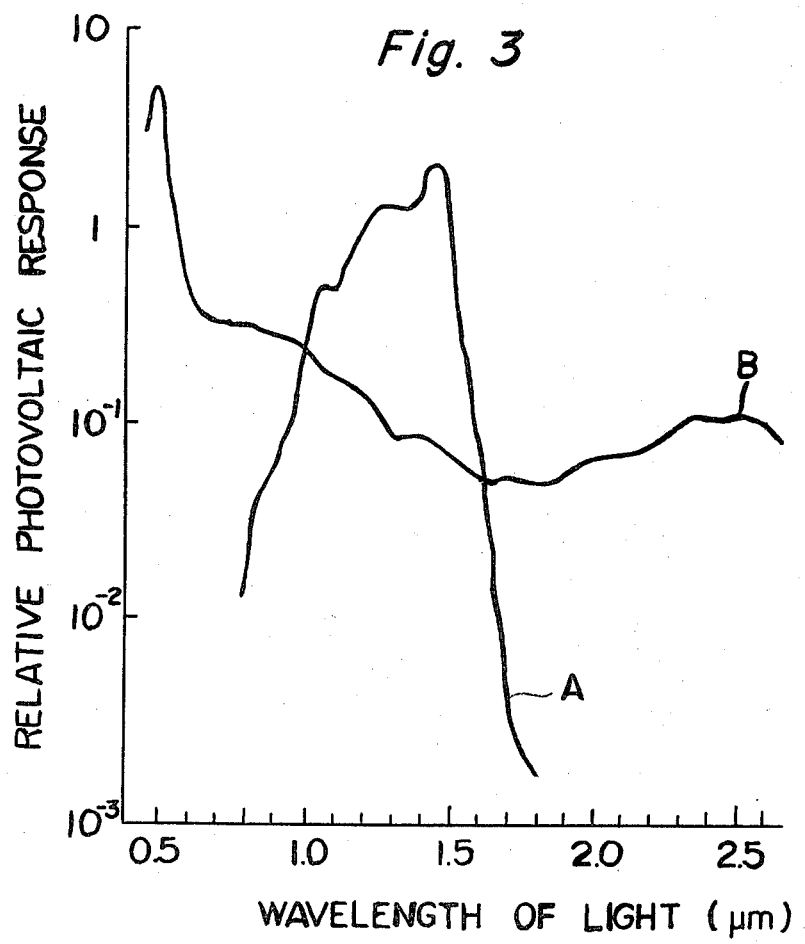
FIG. 3 is a diagram showing the relative spectral photovoltaic responses versus wavelengths at 296° K. and 79° K. of a photovoltaic converter of the invention which includes a p-n heterojunction of $HgCr_2Se_4$ and $CdIn_2S_4$.

As is seen from FIG. 3, the long wavelength edge of the spectral photovoltaic response of the photovoltaic converter obtained in the Example was about 1.7 $\mu m$ at 296° K., and at 296° K. it was at least larger than about 2.6 $\mu m$ which is considerably larger than the long wavelength edge. The short wavelength edge of the range of spectral photovoltaic response was about 0.8 $\mu m$ at 296° K., and about 0.45 $\mu m$ at 79° K.

The short wavelength edge at 70° K. coincides substantially with the optical absorption edge of $CdIn_2S_4$, whereas the short wavelength edge at 296° K. does not coincide with the optical absorption edge of $CdIn_2S_4$. We have so far failed to elucidate a cause of this difference.

What we claim is:

1. Photovoltaic converter comprising a main unit consisting of a p-n heterojunction of a p- or n-type magnetic semiconductor $MCr_2X_4$ in which M represents any one of Zn, Cd and Hg and X represents any one of O, S, Se and Te and an n- or p-type semiconductor $M'In_2S_4$ in which M' represents anyone of Zn, Cd and Hg and which has an optical absorption edge at a shorter wavelength than the optical absorption edge of the semiconductor $MCr_2X_4$; a first electrode ohmically fixed to the surface of the semiconductor $MCr_2X_4$; and a second electrode fixed ohmically to the surface of the semiconductor $M'In_2S_4$ and allowing light to reach the surface of the semiconductor $M'In_2S_4$.

2. The photovoltaic converter of claim 1 wherein the $MCr_2X_4$ is $HgCr_2Se_4$, and $M'In_2S_4$ is $CdIn_2S_4$.

3. The photovoltaic converter of claim 2 wherein the first electrode is formed of Au which is vacuum-deposited on the surface of the $HgCr_2Se_4$, and the second electrode is formed of In which is vacuum-deposited on the surface of the $CdIn_2S_4$.

* * * * *